(12) United States Patent
Cook et al.

(10) Patent No.: US 9,425,653 B2
(45) Date of Patent: Aug. 23, 2016

(54) TRANSMITTERS FOR WIRELESS POWER TRANSMISSION

(71) Applicant: QUALCOMM Incorporated, San Diego, CA (US)

(72) Inventors: Nigel P. Cook, El Cajon, CA (US); Lukas Sieber, Olten (CH); Hanspeter Widmer, Wohlenschwil (CH)

(73) Assignee: QUALCOMM Incorporated, San Diego, CA (US)

( * ) Notice: Subject to any disclaimer, the term of this patent is extended or adjusted under 35 U.S.C. 154(b) by 427 days.

(21) Appl. No.: 14/019,930

(22) Filed: Sep. 6, 2013

(65) Prior Publication Data

US 2014/0001882 A1     Jan. 2, 2014

Related U.S. Application Data

(63) Continuation of application No. 12/561,069, filed on Sep. 16, 2009, now Pat. No. 8,532,724.

(60) Provisional application No. 61/097,859, filed on Sep. 17, 2008, provisional application No. 61/098,742, filed on Sep. 20, 2008, provisional application No. 61/147,081, filed on Jan. 24, 2009, provisional application No. 61/218,838, filed on Jun. 19, 2009.

(51) Int. Cl.
*H01F 27/42*    (2006.01)
*H01F 37/00*    (2006.01)
*H01F 38/00*    (2006.01)
(Continued)

(52) U.S. Cl.
CPC ............. *H02J 17/00* (2013.01); *H02J 5/005* (2013.01); *H03F 3/2176* (2013.01)

(58) Field of Classification Search
CPC .......... H02J 5/005; H02J 7/025; H02J 17/00; H01F 38/14
USPC ....................................................... 307/104
See application file for complete search history.

(56) References Cited

U.S. PATENT DOCUMENTS 4,213,103 A    7/1980   Birt
5,239,459 A    8/1993   Hunt et al.
(Continued)

FOREIGN PATENT DOCUMENTS

CN        1256559 A     6/2000
CN     101086768 A     12/2007
(Continued)

OTHER PUBLICATIONS

Nathan O. Sokal, Class-E RF Power Amplifiers, Jan./Feb. 2001, Desing Automation, Inc APRL Technical Advisor. Figure 2.*
(Continued)

*Primary Examiner* — Carlos Amaya
(74) *Attorney, Agent, or Firm* — Knobbe, Martens, Olson & Bear LLP

(57) ABSTRACT

Exemplary embodiments are directed to wireless power transfer. A wireless power transmitter includes a transmit antenna configured as a resonant tank including a loop inductor and an antenna capacitance. The transmitter further includes an amplifier configured to drive the transmit antenna and a matching circuit operably coupled between the transmit antenna and the amplifier. The transmitter also includes a capacitor integrating the antenna capacitance and a matching circuit capacitance.

21 Claims, 12 Drawing Sheets

(51) Int. Cl.
*H02J 17/00* (2006.01)
*H02J 5/00* (2016.01)
*H03F 3/217* (2006.01)

(56) References Cited

U.S. PATENT DOCUMENTS

| | | | |
|---|---|---|---|
| 5,276,912 | A | 1/1994 | Siwiak et al. |
| 5,671,133 | A | 9/1997 | Fujita et al. |
| 5,675,232 | A | 10/1997 | Koenck |
| 5,905,360 | A | 5/1999 | Ukita |
| 5,912,552 | A | 6/1999 | Tateishi |
| 5,955,865 | A | 9/1999 | Koike et al. |
| 5,991,172 | A | 11/1999 | Jovanovic et al. |
| 6,169,389 | B1 | 1/2001 | Chen |
| 6,243,566 | B1 | 6/2001 | Peckham et al. |
| 6,275,143 | B1 | 8/2001 | Stobbe |
| 6,301,128 | B1 | 10/2001 | Jang et al. |
| 6,321,067 | B1 | 11/2001 | Suga et al. |
| 6,373,790 | B1 | 4/2002 | Fujisawa |
| 6,380,801 | B1 | 4/2002 | McCartney |
| 6,400,274 | B1 | 6/2002 | Duan et al. |
| 6,462,647 | B1 | 10/2002 | Roz |
| 6,515,878 | B1 | 2/2003 | Meins et al. |
| 6,646,415 | B1 | 11/2003 | Nebrigic et al. |
| 6,724,263 | B2 | 4/2004 | Sugiura |
| 6,757,182 | B2 | 6/2004 | Smidt et al. |
| 6,791,298 | B2 | 9/2004 | Shenai et al. |
| 6,907,231 | B2 | 6/2005 | Bhatti |
| 7,071,792 | B2 | 7/2006 | Meck |
| 7,088,971 | B2 | 8/2006 | Burgener et al. |
| 7,307,475 | B2 | 12/2007 | Coleman |
| 7,372,775 | B2 | 5/2008 | Hayashi |
| 7,518,267 | B2 | 4/2009 | Baarman |
| 7,535,362 | B2 | 5/2009 | Moser et al. |
| 7,612,527 | B2 | 11/2009 | Hoffman et al. |
| 7,741,734 | B2 | 6/2010 | Joannopoulos et al. |
| 7,747,228 | B2 | 6/2010 | Kasha et al. |
| 7,825,543 | B2 | 11/2010 | Karalis et al. |
| 7,917,104 | B2 | 3/2011 | Manssen et al. |
| 8,432,070 | B2 | 4/2013 | Cook et al. |
| 2001/0030581 | A1 | 10/2001 | Dent |
| 2002/0096568 | A1 | 7/2002 | Arisawa |
| 2002/0140403 | A1 | 10/2002 | Reddy |
| 2002/0154518 | A1 | 10/2002 | Elferich et al. |
| 2003/0214821 | A1 | 11/2003 | Giannopoulos et al. |
| 2005/0029351 | A1* | 2/2005 | Yoshinaga ........... G06K 7/0008 235/451 |
| 2005/0134213 | A1 | 6/2005 | Takagi et al. |
| 2006/0290475 | A1 | 12/2006 | Murdoch et al. |
| 2007/0008140 | A1 | 1/2007 | Saarisalo et al. |
| 2007/0010217 | A1 | 1/2007 | Takahashi et al. |
| 2007/0120421 | A1 | 5/2007 | Boys |
| 2007/0252441 | A1 | 11/2007 | Yamauchi et al. |
| 2008/0088471 | A1 | 4/2008 | Smith et al. |
| 2008/0122401 | A1 | 5/2008 | Sato et al. |
| 2008/0224655 | A1 | 9/2008 | Tilley et al. |
| 2009/0045772 | A1 | 2/2009 | Cook et al. |
| 2010/0109443 | A1 | 5/2010 | Cook et al. |
| 2010/0148723 | A1 | 6/2010 | Cook et al. |
| 2010/0184371 | A1 | 7/2010 | Cook et al. |
| 2012/0119698 | A1* | 5/2012 | Karalis ................ B60L 11/182 320/108 |
| 2012/0262004 | A1 | 10/2012 | Cook et al. |

FOREIGN PATENT DOCUMENTS

| | | |
|---|---|---|
| CN | 101253684 A | 8/2008 |
| DE | 1019714 B | 11/1957 |
| EP | 0533247 A1 | 3/1993 |
| EP | 0829940 A2 | 3/1998 |
| EP | 1494162 A2 | 1/2005 |
| EP | 1646122 A1 | 4/2006 |
| EP | 1795915 A2 | 6/2007 |
| EP | 1914669 A2 | 4/2008 |
| JP | S6132394 A | 2/1986 |
| JP | S63155826 A | 6/1988 |
| JP | H03128627 A | 5/1991 |
| JP | 3239003 A | 10/1991 |
| JP | H04509 A | 1/1992 |
| JP | 07170132 | 7/1995 |
| JP | 7231585 A | 8/1995 |
| JP | 10145987 A | 5/1998 |
| JP | 10256957 | 9/1998 |
| JP | H11155245 A | 6/1999 |
| JP | 2000165132 A | 6/2000 |
| JP | 2001197736 A | 7/2001 |
| JP | 2001309580 A | 11/2001 |
| JP | 2002010534 A | 1/2002 |
| JP | 2002369414 A | 12/2002 |
| JP | 2002369415 A | 12/2002 |
| JP | 2003299255 A | 10/2003 |
| JP | 2004194400 A | 7/2004 |
| JP | 2004206245 A | 7/2004 |
| JP | 2004206383 A | 7/2004 |
| JP | 2004206937 A | 7/2004 |
| JP | 2005026741 A | 1/2005 |
| JP | 2005137040 | 5/2005 |
| JP | 2005143181 A | 6/2005 |
| JP | 2005536927 A | 12/2005 |
| JP | 2007252027 A | 9/2007 |
| JP | 2008125198 A | 5/2008 |
| JP | 2008206306 A | 9/2008 |
| JP | 2010507142 A | 3/2010 |
| KR | 20050005480 A | 1/2005 |
| KR | 20070039127 A | 4/2007 |
| WO | 9810836 | 3/1998 |
| WO | 03105311 A1 | 12/2003 |
| WO | WO-2004019055 A1 | 3/2004 |
| WO | 2004070941 | 8/2004 |
| WO | 2006006142 A1 | 1/2006 |
| WO | 2006022365 A1 | 3/2006 |
| WO | 2007034421 A2 | 3/2007 |
| WO | 2009070730 A2 | 6/2009 |
| WO | 2010062198 A1 | 6/2010 |

OTHER PUBLICATIONS

Birca-Galateanu, S., "Low peak current Class E resonant full-wave low dv/dt rectifier driven by a square wave voltage generator", Power Electronics Specialists Conference 1999 (PESC '99), 30th Annual IEEE, Publication Date: Aug. 1999, pp. 469-474, vol. 1.

Fernandez C, et al., "Overview of Different Alternatives for the Contact-Less Transmission of Energy" IECON-2002. Proceedings of the 28th. Annual Conference of the IEEE Industrial Electronics Society. Sevilla, Spain, Nov. 5-8, 2002; [Annual Conference of the IEEE Industrial Electronics Society, IEEE, New York,NY, US LNKDDOI: 10.1109/IECON.2002.11, vol. 2, Nov. 8, 2002, pp. 1319-1323, XP001516268.

"Hyperfast Rectifier" International Rectifier ,Dec. 31, 2006, XP002576261 Retrieved from the Internet: URL:http://www.irf.com/product-info/datash eets/data/30cth02.pdf>.

International Search Report and Written Opinion—PCT/US09/057355—ISA/EPO—Apr. 16, 2010.

Kobayashi H, et al., "Current Mode Class-D Power Amplifiers for High Efficiency RF Applications" 2001 IEEE MTT-S International Microwave Symposium Digest.(IMS 2001). Phoenix, AZ, May 20-25, 2001; [IEEE MTT-S International Microwave Symposium], New York, NY : IEEE, US LNKDDOI: 10.1109/MWSYM.2001.967047, May 20, 2001, pp. 939-942, XP001067408.

Low, et al., "Design and Test of a High-Power High-Efficiency Loosely Coupled Planar Wireless Power Transfer System," IEEE Transactions on Industrial Electronics, vol. 56, No. 5, May 2009, pp. 1801-1812.

"MR750 Series, High Current Lead Mounted Rectifiers" ON Semiconductor, Oct. 31, 2000, XP002576260 Retrieved from the Internet: URL:http://www.rose-hulman.edu/{herniter/Data_Sheets/MR750-D.pdf>.

"Surface Mount Schottky Power Rectifier MBRS2040LT3" Motorola Semiconductor, Dec. 31, 1996, XP002576262 Retrieved from the Internet: URL:http://www.datasheetcatalog.net/de/datasheets_pdf/M/B/R/S/MBRS2040LT3.shtml>.

* cited by examiner

TRANSMITTERS FOR WIRELESS POWER TRANSMISSION

CLAIM OF PRIORITY

This application is a continuation of U.S. patent application Ser. No. 12/561,069 entitled "TRANSMITTERS FOR WIRELESS POWER TRANSMISSION," filed Sep. 16, 2009, the disclosure of which is hereby incorporated by reference in its entirety. Application Ser. No. 12/561,069 claimed priority under 35 U.S.C. §119(e) to:

U.S. Provisional Patent Application 61/098,742 entitled "MAGNETIC POWER USING A CLASS E AMPLIFIER" filed on Sep. 20, 2008, the disclosure of which is hereby incorporated by reference in its entirety.

U.S. Provisional Patent Application 61/097,859 entitled "HIGH EFFICIENCY TECHNIQUES AT HIGH FREQUENCY" filed on Sep. 17, 2008, the disclosure of which is hereby incorporated by reference in its entirety.

U.S. Provisional Patent Application 61/147,081 entitled "WIRELESS POWER ELECTRONIC CIRCUIT" filed on Jan. 24, 2009, the disclosure of which is hereby incorporated by reference in its entirety.

U.S. Provisional Patent Application 61/218,838 entitled "DEVELOPMENT OF HF POWER CONVERSION ELECTRONICS" filed on Jun. 19, 2009, the disclosure of which is hereby incorporated by reference in its entirety.

BACKGROUND

1. Field

The present invention relates generally to wireless charging, and more specifically to devices, systems, and methods related to portable wireless charging systems.

2. Background

Typically, each powered device such as a wireless electronic device requires its own wired charger and power source, which is usually an alternating current (AC) power outlet. Such a wired configuration becomes unwieldy when many devices need charging. Approaches are being developed that use over-the-air or wireless power transmission between a transmitter and a receiver coupled to the electronic device to be charged. The receive antenna collects the radiated power and rectifies it into usable power for powering the device or charging the battery of the device. Wireless energy transmission may be based on coupling between a transmit antenna, a receive antenna and a rectifying circuit embedded in the host electronic device to be powered or charged. Transmitters, including transmit antennas, face conflicting design constraints such as relative small volume, high efficiency, a low Bill Of Materials (BOM), and high reliability. Accordingly, there is a need to improve a transmitter design for wireless power transmission which satisfy the various design objectives.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

The term "wireless power" is used herein to mean any form of energy associated with electric fields, magnetic fields, electromagnetic fields, or otherwise that is transmitted from a transmitter to a receiver without the use of physical electromagnetic conductors. Power conversion in a system is described herein to wirelessly charge devices including, for example, mobile phones, cordless phones, iPod®, MP3 players, headsets, etc. Generally, one underlying principle of wireless energy transfer includes magnetic coupled resonance (i.e., resonant induction) using frequencies, for example, below 30 MHz. However, various frequencies may be employed including frequencies where license-exempt operation at relatively high radiation levels is permitted, for example, at either below 135 kHz (LF) or at 13.56 MHz (HF). At these frequencies normally used by Radio Frequency Identification (RFID) systems, systems must comply with interference and safety standards such as EN 300330 in Europe or FCC Part 15 norm in the United States. By way of illustration and not limitation, the abbreviations LF and HF are used herein where "LF" refers to $f_0=135$ kHz and "HF" to refers to $f_0=13.56$ MHz.

Figure 1:
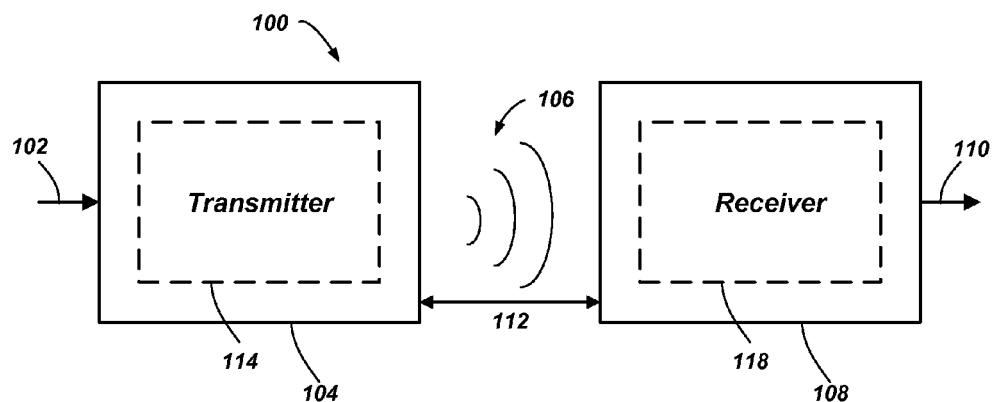
FIG. 1 illustrates a simplified block diagram of a wireless power transmission system.

FIG. 1 illustrates wireless power transmission system 100, in accordance with various exemplary embodiments. Input power 102 is provided to a transmitter 104 for generating a magnetic field 106 for providing energy transfer. A receiver 108 couples to the magnetic field 106 and generates an output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship and when the resonant frequency of receiver 108 and the resonant frequency of transmitter 104 are matched, transmission losses between the transmitter 104 and the receiver 108 are minimal when the receiver 108 is located in the "near-field" of the magnetic field 106.

Transmitter 104 further includes a transmit antenna 114 for providing a means for energy transmission and receiver 108 further includes a receive antenna 118 for providing a means for energy reception or coupling. The transmit and receive antennas are sized according to applications and devices to be associated therewith. As stated, an efficient energy transfer occurs by coupling a large portion of the energy in the near-field of the transmitting antenna to a receiving antenna rather than propagating most of the energy in an electromagnetic wave to the far-field. In this near-field, a coupling may be established between the transmit antenna 114 and the receive antenna 118. The area around the antennas 114 and 118 where this near-field coupling may occur is referred to herein as a coupling-mode region.

Figure 2:
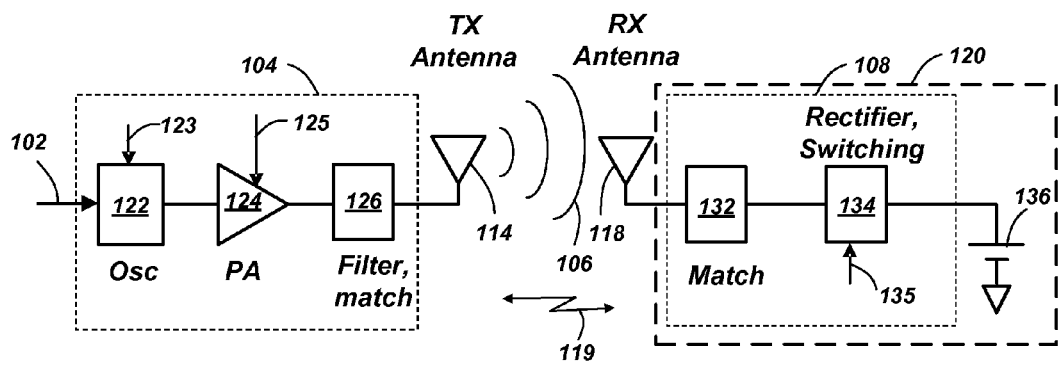
FIG. 2 illustrates a simplified schematic diagram of a wireless power transmission system.

FIG. 2 shows a simplified schematic diagram of a wireless power transmission system. The transmitter 104, driven by input power 102, includes an oscillator 122, a power amplifier or power stage 124 and a filter and matching circuit 126. The oscillator is configured to generate a desired frequency, which may be adjusted in response to adjustment signal 123. The oscillator signal may be amplified by the power amplifier 124 with an amplification amount responsive to control signal 125. The filter and matching circuit 126 may be included to filter harmonics or other unwanted frequencies and match the impedance of the transmitter 104 to the transmit antenna 114.

An electronic device 120 includes the receiver 108 which may include a matching circuit 132 and a rectifier and switching circuit 134 to generate a DC power output to charge a battery 136 as shown in FIG. 2 or power a device electronics (not shown) coupled to the receiver. The matching circuit 132 may be included to match the impedance of the receiver 108 to the receive antenna 118.

Figure 3:
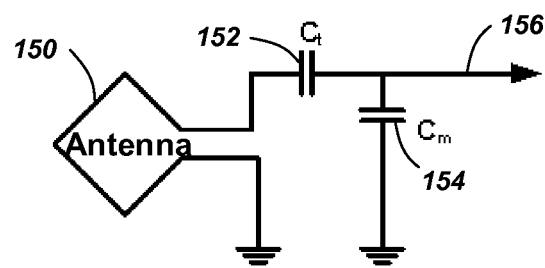
FIG. 3 illustrates a schematic diagram of a loop antenna, in accordance with exemplary embodiments.

As illustrated in FIG. 3, antennas used in exemplary embodiments may be configured as a "loop" antenna 150, which may also be referred to herein as a "magnetic," "resonant" or a "magnetic resonant" antenna. Loop antennas may be configured to include an air core or a physical core such as a ferrite core. Furthermore, an air core loop antenna allows the placement of other components within the core area. In addition, an air core loop may more readily enable placement of the receive antenna 118 (FIG. 2) within a plane of the transmit antenna 114 (FIG. 2) where the coupled-mode region of the transmit antenna 114 (FIG. 2) may be more effective.

As stated, efficient transfer of energy between the transmitter 104 and receiver 108 occurs during matched or nearly matched resonance between the transmitter 104 and the receiver 108. However, even when resonance between the transmitter 104 and receiver 108 are not matched, energy may be transferred at a lower efficiency. Transfer of energy occurs by coupling energy from the near-field of the transmitting antenna to the receiving antenna residing in the neighborhood where this near-field is established rather than propagating the energy from the transmitting antenna into free space.

The resonant frequency of the loop antennas is based on the inductance and capacitance. Inductance in a loop antenna is generally the inductance created by the loop, whereas, capacitance is generally added to the loop antenna's inductance to create a resonant structure at a desired resonant frequency. As a non-limiting example, capacitor 152 and capacitor 154 may be added to the antenna to create a resonant circuit that generates a sinusoidal or quasi-sinusoidal signal 156. Accordingly, for larger diameter loop antennas, the size of capacitance needed to induce resonance decreases as the diameter or inductance of the loop increases. Furthermore, as the diameter of the loop antenna increases, the efficient energy transfer area of the near-field increases for "vicinity" coupled devices. Of course, other resonant circuits are possible. As another non-limiting example, a capacitor may be placed in parallel between the two terminals of the loop antenna. In addition, those of ordinary skill in the art will recognize that for transmit antennas the resonant signal 156 may be an input to the loop antenna 150.

Exemplary embodiments of the invention include coupling power between two antennas that are in the near-fields of each other. As stated, the near-field is an area around the antenna in which electromagnetic fields exist but may not propagate or radiate away from the antenna. They are typically confined to a volume that is near the physical volume of the antenna. In the exemplary embodiments of the invention, antennas such as single and multi-turn loop antennas are used for both transmit (Tx) and receive (Rx) antenna systems since most of the environment possibly surrounding the antennas is dielectric and thus has less influence on a magnetic field compared to an electric field. Furthermore, antennas dominantly configured as "electric" antennas (e.g., dipoles and monopoles) or a combination of magnetic and electric antennas is also contemplated.

The Tx antenna can be operated at a frequency that is low enough and with an antenna size that is large enough to achieve good coupling efficiency (e.g., >10%) to a small Rx antenna at significantly larger distances than allowed by far-field and inductive approaches mentioned earlier. If the Tx antenna is sized correctly, high coupling efficiencies (e.g., 30%) can be achieved when the Rx antenna on a host device is placed within a coupling-mode region (i.e., in the near-field or a strongly coupled regime) of the driven Tx loop antenna As described herein, "proximity" coupling and "vicinity" coupling may require different matching approaches to adapt power source/sink to the antenna/coupling network. Moreover, the various exemplary embodiments provide system parameters, design targets, implementation variants, and specifications for both LF and HF applications and for the transmitter and receiver. Some of these parameters and specifications may vary, as required for example, to better match with a specific power conversion approach. System design parameters may include various priorities and tradeoffs. Specifically, transmitter and receiver subsystem considerations may include high transmission efficiency, low complexity of circuitry resulting in a low-cost implementation.

Figure 4:
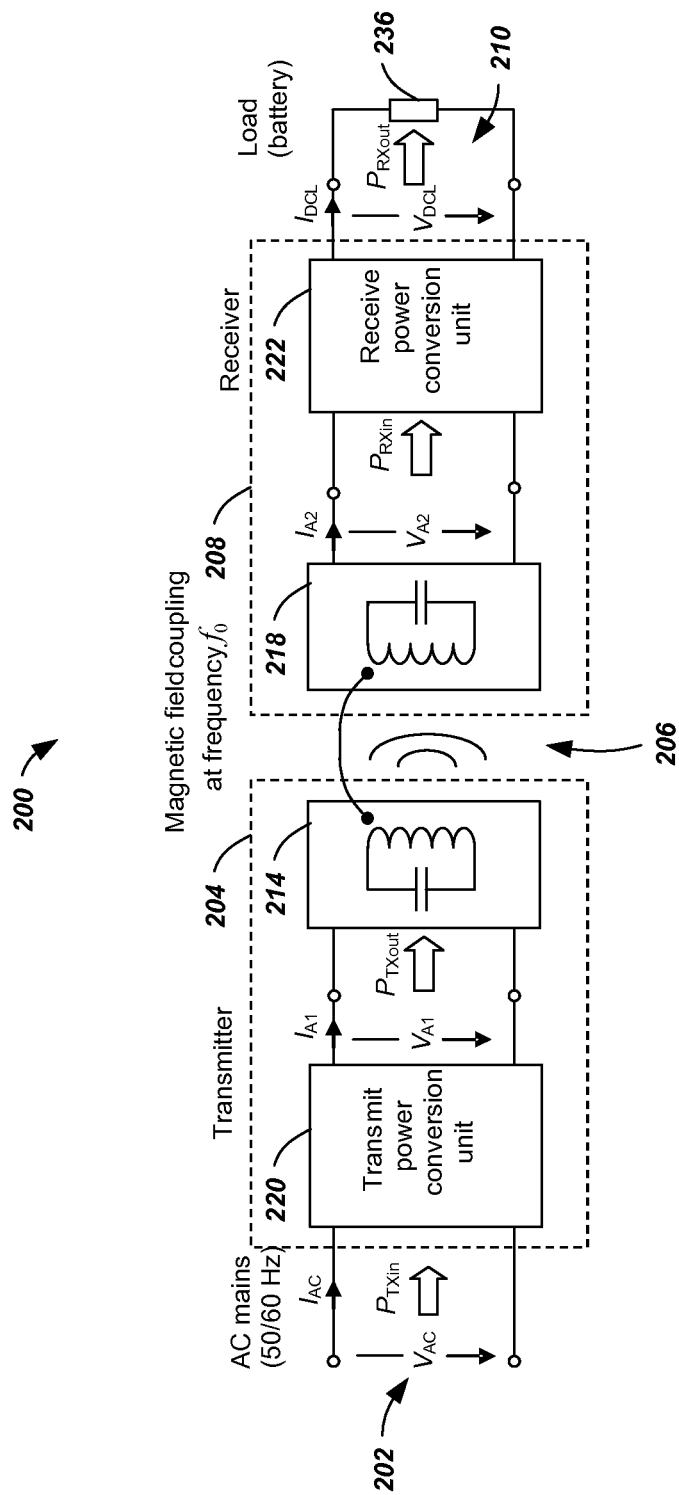
FIG. 4 illustrates a functional block diagram of a wireless power transmission system, in accordance with an exemplary embodiment.

FIG. 4 illustrates a functional block diagram of a wireless power transmission system configured for direct field coupling between a transmitter and a receiver, in accordance with an exemplary embodiment. Wireless power transmission system 200 includes a transmitter 204 and a receiver 208. Input power $P_{TXin}$ is provided to transmitter 204 for generating a predominantly non-radiative field with direct field coupling 206 defined by coupling factor k for providing energy transfer. Receiver 208 directly couples to the non-radiative field 206 and generates an output power $P_{RXout}$ for storing or consumption by a battery or load 236 coupled to the output port 210. Both the transmitter 204 and the receiver 208 are separated by a distance. In one exemplary embodiment, transmitter 204 and receiver 208 are configured according to a mutual resonant relationship and when the resonant frequency, $f_0$, of receiver 208 and the resonant frequency of transmitter 204 are matched, transmission losses between the transmitter 204 and the receiver 208 are minimal while the receiver 208 is located in the "near-field" of the radiated field generated by transmitter 204.

Transmitter 204 further includes a transmit antenna 214 for providing a means for energy transmission and receiver 208 further includes a receive antenna 218 for providing a means for energy reception. Transmitter 204 further includes a transmit power conversion unit 220 at least partially function as an AC-to-AC converter. Receiver 208 further includes a receive power conversion unit 222 at least partially functioning as an AC-to-DC converter.

Various transmitter configurations are described herein which use capacitively loaded wire loops or multi-turn coils forming a resonant structure that is capable to efficiently couple energy from transmit antenna 214 to the receive antenna 218 via the magnetic field if both the transmit antenna 214 and receive antenna 218 are tuned to a common resonance frequency. Accordingly, highly efficient wireless charging of electronic devices (e.g. mobile phones) in a strongly coupled regime is described where transmit antenna 214 and receive antenna 218 are in close proximity resulting in coupling factors typically above 30%. Accordingly, various transmitter concepts comprised of a wire loop/coil antenna and a transmit power conversion unit are described herein.

Figure 5:
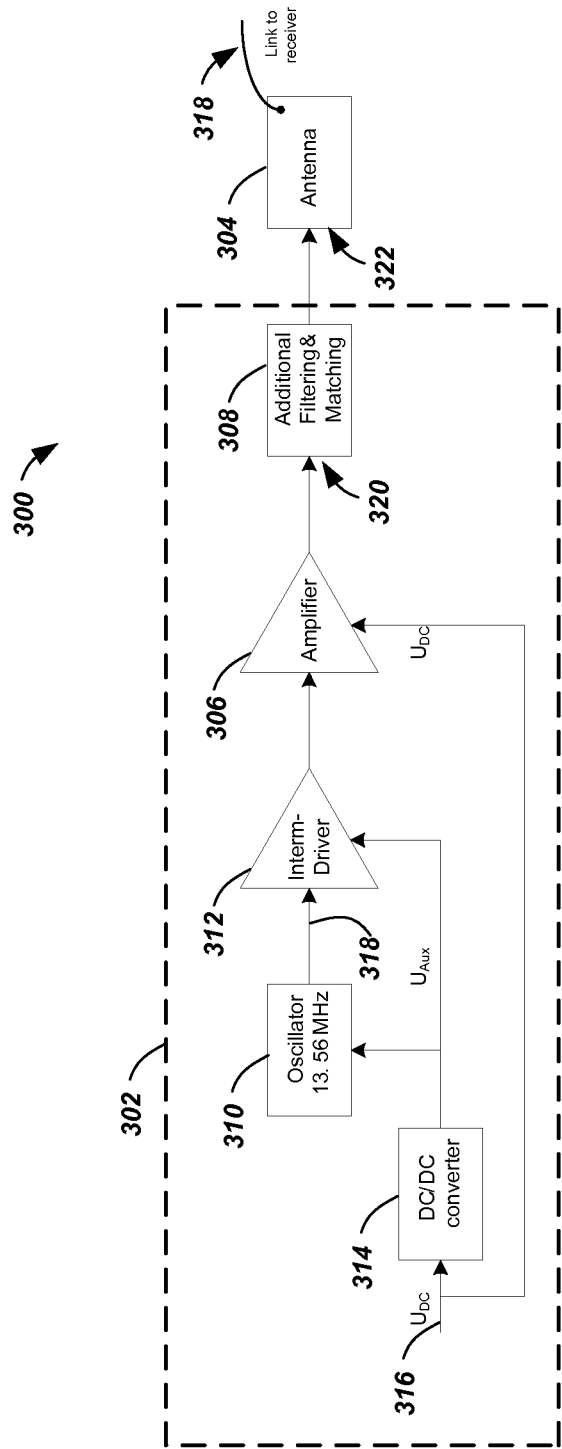
FIG. 5 illustrates a block diagram of a wireless power transmitter, in accordance with exemplary embodiments.

FIG. 5 illustrates a block diagram of a wireless power transmitter, in accordance with exemplary embodiments. A transmitter 300 includes a transmit power conversion unit 302 and a transmit antenna 304. Transmit power conversion unit 302 includes an amplifier 306, an example of which is a class-E amplifier, that is used to drive transmit antenna 304. A filter and matching circuit 308 provides load matching and/or filtering of the driving signal generated by the amplifier 306. It is noted that the term "amplifier," as used in relation to a class-E amplifier 306, also corresponds to an "inverter," "chopper," or "power stage" because the amplification is highly non-linear and the main objective is to generate a substantially unmodulated signal for wireless power.

Transmit power conversion unit 302 further includes an oscillator 310 which generates a substantially unmodulated signal to intermediate driver 312 which in turn drives the amplifier 306. Oscillator 310 may be implemented as a stable frequency source providing a square-wave signal with a 50% duty cycle. Intermediate driver 312 is configured to provide adequate drive for controlling transistors (e.g., MOSFETs) within the amplifier 306. The different operating voltages required by the oscillator 310, intermediate driver 312 and the amplifier 306 are generated by a DC/DC converter 314 in response to input voltage 316. In one exemplary embodiment, the amplifier 306 receives oscillator signal 318 at a frequency of 13.56 MHz and amplifies the oscillator signal to a power level on the order of, for example, 7 watts.

The exemplary embodiment of FIG. 5 provides an implementation based upon a reduced number of components and does not need additional circuitry to control the duty cycle due to the fixed duty cycle operation. Furthermore, the exemplary embodiment of FIG. 5 can be implemented with a single transistor which results in a low harmonic content on the output signal due to a resonant load network needed for class-E operation.

Further by way of implementation, to design the class-E implementation of amplifier 306 and filter and matching circuitry 308, the range of the antenna input impedance 322 and the load impedance 320 for the class-E operation of amplifier 306 need to be characterized. Further figures and description herein disclose measurements and modeling for determining those impedances.

Figure 6A:
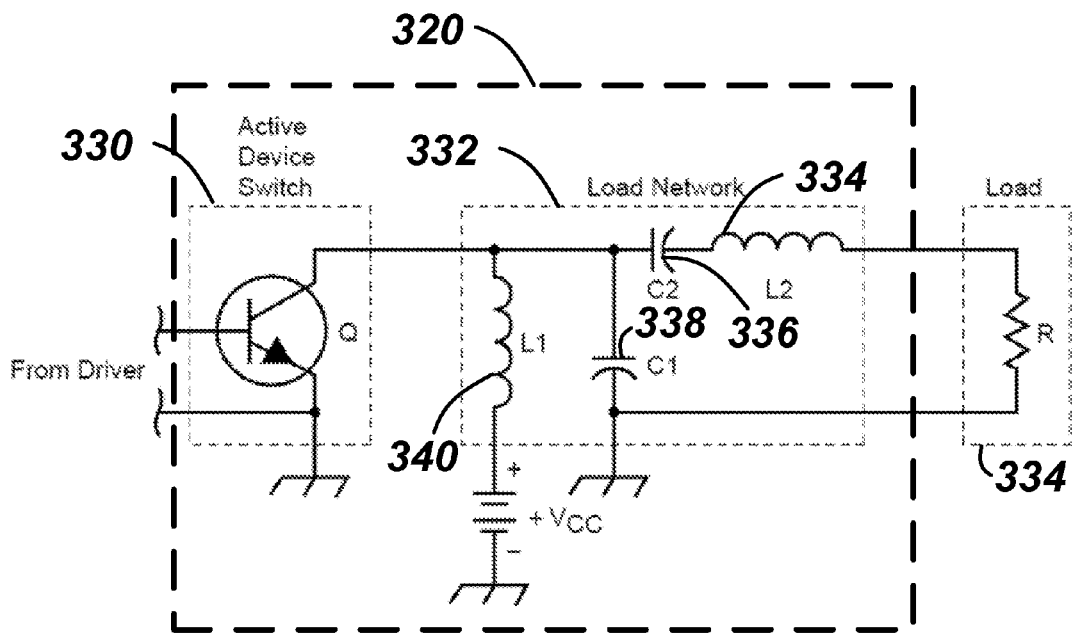
FIGS. 6A-6B illustrate a class-E amplifier including waveforms, in accordance with an exemplary embodiment.

FIG. 6A illustrates an amplifier configured as a class-E amplifier, in accordance with an exemplary embodiment. An example of a transmitter configured with various amplifiers suitable for a wireless power transmitter operating at, for example, 13.56 MHz. A class-E amplifier 320 includes an active device switch 330, a load network 332 and the load 334 illustrated as being a purely resistive load. The class-E amplifier 320 of FIG. 6A illustrates a single-ended class-E amplifier.

The load network 332, including inductor L1 340, capacitor C1 338, capacitor C2 336 and inductor L2 334, is used to shape the current and voltage waveform in a way that the active device switch 330 switches under zero-voltage and zero-current conditions. This heavily reduces switching losses since a major contributor to inefficiency is the power loss occurring in active device switch 330. In addition, the parasitic capacitance (not shown) of the active device switch 330 (usually a FET) is used as a part of capacitor C1 338 thus the negative influence of the parasitic capacitance is eliminated.

Figure 6B:
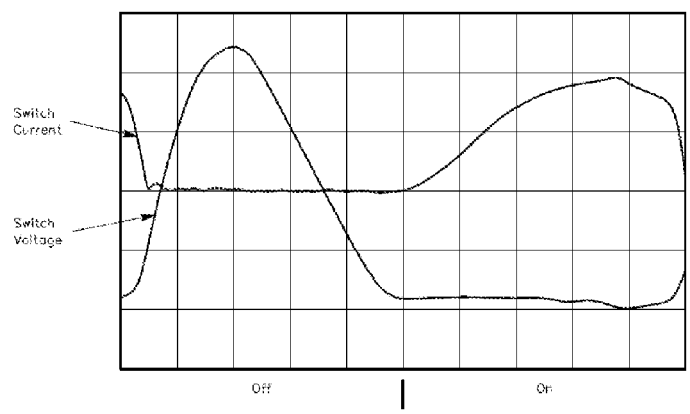

FIG. 6B illustrates the resulting voltage and current waveforms of the active device switch 330 in a class-E configuration. At the switch-on instant (center of plot), the current and the voltage over the active device switch 330 is almost zero, leading to reduced switching losses. The same is true in the switch-off instant (end of plot) where the voltage rises only when the current is zero already.

Components for the class-E amplifier 306 may be determined according to the following formulae:

$$L_1 = \frac{10}{\omega^2 \cdot C_1} \tag{1}$$

$$L_2 = \frac{Q_L \cdot R_{Load}}{\omega} \tag{2}$$

$$C_1 = \frac{0.2}{\omega \cdot R_{Load}} \tag{3}$$

$$C_2 = \frac{1}{\omega \cdot Q_L \cdot R_{Load}} \cdot \left(1 + \frac{1.11}{Q_L - 1.7879}\right) \tag{4}$$

$$P_{out} = 0.5768 \cdot \frac{(V_{CC} - V_{CEsat})^2}{R_{Load}} \quad (5)$$

$$V_{CEpeak} = 3.563 \cdot V_{CC} - 2.562 \cdot V_{CEsat} \quad (6)$$

(This formulae was given originally by the inventor of the class E amplifier, Nathan O. Sokal. Some reference should be given here (e.g. Sokal N. O., Sokal A. D., "Class E—a New Class of High Efficiency Tuned Single Ended Switching Power Amplifiers" IEEE Journal of Solid-State Circuits, Vol. SC-10, No. 3, June 1975)

By way of implementation, the quality factor of the load network ($Q_L = \omega L_2 / R_{Load}$) has to be larger than 1.7879, otherwise capacitor C2 336 becomes negative and a class-E configuration is inoperable. Furthermore, capacitor C2 336 has to be larger than the collector-to-emitter capacitance (or drain-source capacitance) of the active device switch 330. Accordingly, all the components of the load network are dependent of $R_{Load}$. Since $R_{Load}$ changes in the case of wireless power with the coupling factor (k) to the receiver, the load network probably has to be adjusted dynamically or needs to be designed for a good trade-off taking into account all operation conditions.

Figure 7:
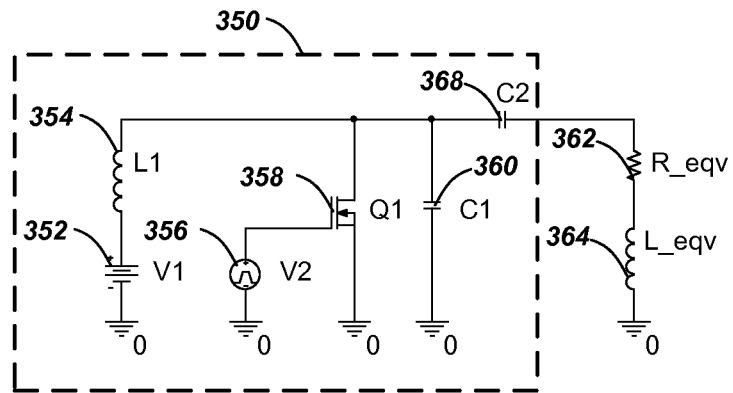
FIG. 7 illustrates a circuit diagram of a loaded a asymmetric class-E amplifier, in accordance with an exemplary embodiment.

The class-E amplifier 320 of FIG. 6A can be adapted for wireless power transmission. FIG. 7 illustrates a circuit diagram of an asymmetric class-E amplifier 350, in accordance with an exemplary embodiment. At the transmit antenna input port, the coupling network comprised of the magnetically coupled transmit antenna and the loaded receive antenna can be represented in a first approximation by an L-R-circuit (equivalent resistance $R_{\_eqv}$ 362 and equivalent inductance $L_{\_eqv}$ 364 in FIG. 7). Equivalent inductance $L_{\_eqv}$ 364 becomes a part of the load network (compare FIG. 6A component inductor L2 334), and equivalent resistance $R_{\_eqv}$ 362 becomes the load resistance. Eventually, the inductor $L_{\_eqv}$ 364 is supplemented by an additional series inductor in order to increase the quality factor of the load network. The quality factor should be above 1.79, otherwise the class-E amplifier 350 cannot be designed properly as illustrated with respect of equations 1-6.

Supply voltage 352 provides the power from which the RF signals are generated based on the switching of control signal 356 which drives the active device switch 358. A load network circuit includes inductor L1 354, capacitor C1 360, and capacitor C2 368.

Figure 8:
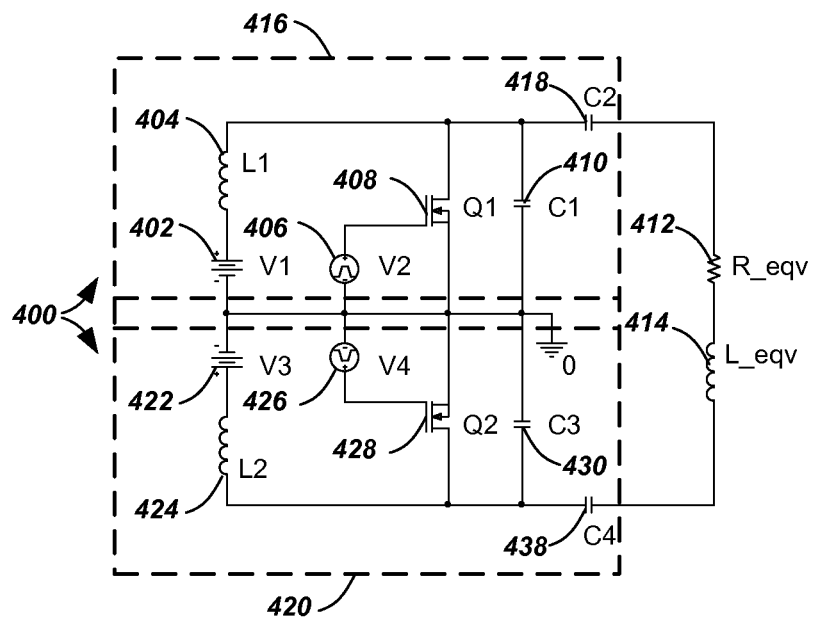
FIG. 8 illustrates a circuit diagram of a loaded symmetric class-E amplifier, in accordance with an exemplary embodiment.

The class-E amplifier 350 may generate harmonic content in the antenna current. To eliminate even order harmonics, a symmetric class-E stage may be used. Odd order harmonics need to be filtered with additional filtering circuitry. FIG. 8 illustrates a circuit diagram of a class-E amplifier 400, in accordance with an exemplary embodiment. A symmetric class-E amplifier 400 is an extension of the asymmetric class-E amplifier 350 (FIG. 7) including a first class-E stage 416 and a second class-E stage 420 configured as a mirror of first class-E stage 416. Signal generators 406, 426 operate at 180° phase shifted from each other and respectively drive switches 408, 428 at a 180° phase shifted waveforms resulting in a push-pull operation.

The two stages share the same load including equivalent resistance $R_{\_eqv}$ 412 and an equivalent inductance $L_{\_eqv}$ 414. If equivalent resistance $R_{\_eqv}$ 412 and an equivalent inductance $L_{\_eqv}$ 414 remain unchanged compared to the asymmetric class-E amplifier 350 of FIG. 7, the capacitance of capacitors C1-C4 410, 418, 430, 438 would have to be doubled in order to maintain Class E operation. This can be explained by the fact that effective inductance as seen per switch 408, 428 is half of equivalent inductance $L_{\_eqv}$ (i.e., inductance $L_{\_eqv}$ splits into two identical halves and is grounded at the symmetry point).

In the first class-E stage 416, a supply voltage 402 provides the power from which the RF signals are generated based on the switching of control signal 406 which drives the active device switch 408. A first load network circuit includes inductor L1 404, capacitor C1 410, and capacitor C2 418. In the second class-E stage 420, a supply voltage 422 provides the power from which the RF signals are generated based on the switching of control signal 426 which drives the active device switch 428. A second load network circuit includes inductor L2 424, capacitor C3 430, and capacitor C4 438.

The symmetric class-E amplifier 400 further eliminates even-order harmonic content in the current provided to the transmit antenna. Such even-order harmonic reduction reduces filtering circuitry that would otherwise be needed for supplementary second-harmonics filtering. Additionally, it can provide higher RF output power compared to the asymmetric class-E stage if both are operated from the same supply voltage.

The class-E amplifier desirably remains stable under different load conditions because various electronic devices or various receiver positions (with relation to the transmitter) of a receiver of an electronic device cause different load conditions. Changing the load condition on a class-E amplifier without adapting its load network will lead to a reduced efficiency and eventually higher stress on the active components. But depending on the type of load change, the impact could be smaller or larger. Various test cases have been simulated according to the component values listed in Table 1.

TABLE 1

Simulated test cases for class-E amplifiers and their component values.

| Case | 1 | 2 | 3 | 4 | 5 |
|---|---|---|---|---|---|
| RL [Ω] | 5 | 10 | 20 | 30 | 40 |
| C1 [pF] | 469 | 235 | 117 | 78 | 58 |
| L1 [uH] | 2.9 | 5.9 | 11.7 | 17.6 | 23.5 |
| C2 [pF] | 632 | 316 | 158 | 105 | 79 |
| L2 [uH] | 0.293 | 0.586 | 1.17 | 1.76 | 2.3 |
| Vcc [V] | 6.7 | 9.4 | 13.3 | 16.2 | 18.7 |

(Note:
RL = target load resistance, Vcc = Supply voltage for the class-E amplifier)

By now varying the load to become either capacitive or inductive, a desired operating region for the class-E power stage can be found. Circuit simulations have shown that the class-E power stage can be designed to operate efficiently on various loads such as produced by the different receiver coupling conditions that need to be supported.

The component values and the required supply voltage were calculated using the formulae of Equations 1-6. The calculated values were optimized in the simulation to get the best possible efficiency with the target load (purely resistive).

Figure 9:
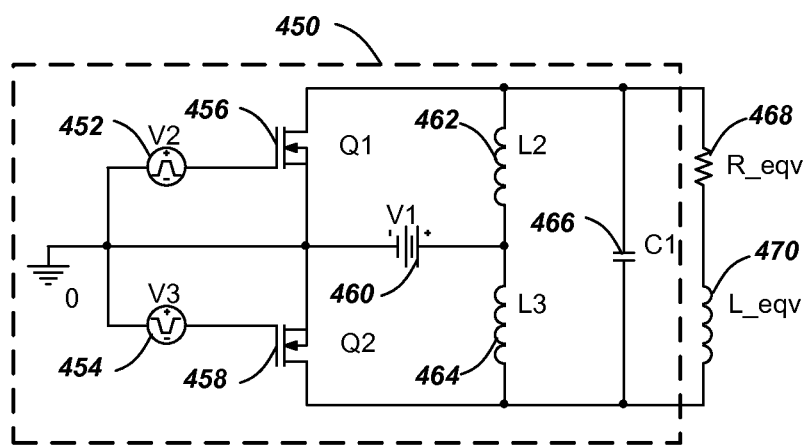
FIG. 9 illustrates a circuit diagram of a loaded dual half bridge amplifier, in accordance with an exemplary embodiment.

FIG. 9 illustrates a circuit diagram of a dual half bridge amplifier, in accordance with an exemplary embodiment. A dual half bridge amplifier 450 drives a parallel tank circuit (not shown) and may be considered as the transformational dual circuit of a half bridge inverter driving a series tank circuit (not shown). The switching voltage and current waveforms are transformational duals to those of a class-D circuit. Compared to a class-E stage, the dual half bridge amplifier 450 does not need the additional shunt capacitors or any inductance to supplement the load network. As opposed to the classical half bridge topology, the dual half bridge provides low dV/dt voltage waveforms and switching is ideally performed at zero voltage instants. Switch transistors junction capacitance (e.g. drain-source capacitance of a FET) may be considered integral part of capacitance needed to achieve resonance in the antenna parallel tank circuit. So there is no abrupt charge and discharge of junction capacitances when switches open and close at zero voltage instants. However, the dual half bridge amplifier may be more susceptible to variations of equivalent inductance $L\_{eqv}$ thus resonant frequency of the parallel tank circuit as the result of any changes in the wireless power link (coupling network) as shown below. In order to achieve or maintain zero voltage switching, switch voltage needs to be phase aligned to switch current In a first order approximation, the coupling network consisting of the magnetically coupled transmit and the loaded receive antenna may be represented at its input port by an L-R series circuit ($L\_{eqv}$ 470, $R\_{eqv}$ 468). A parallel capacitor $C_1$ 466 is added to compensate for the inductive part of the antenna. Proper design and adjustment of capacitor $C_1$ 466 is important as it results in a highly efficient operation of the dual half bridge because any non-compensated reactive part in the load causes a phase-shift between the switch voltage and the switch current making it infeasible to switch transistors in a lossless mode. Since equivalent inductor $L\_{eqv}$ 470 and equivalent resistance $R\_{eqv}$ 468 vary with the coupling to the receiver, capacitor $C_1$ 466 should be adjusted dynamically, if high efficiency is to be maintained in all coupling and loading conditions.

A supply voltage 460 provides the power from which the RF signals are generated based on the switching of control signals 452 and 454 which respectively drive the active device switches 4456 and 458. Chokes L2 462 and L3 464 are used to provide a substantially constant current to the active device switches or the load and to filter RF currents from the supply voltage 460 (compare L1 340 in FIG. 6a). The dual half bridge amplifier 450 may also be configurable in a receiver configured to operate as a synchronous rectifier operating in the positive VI quadrant, as part of a wireless power receiver.

Figure 10:
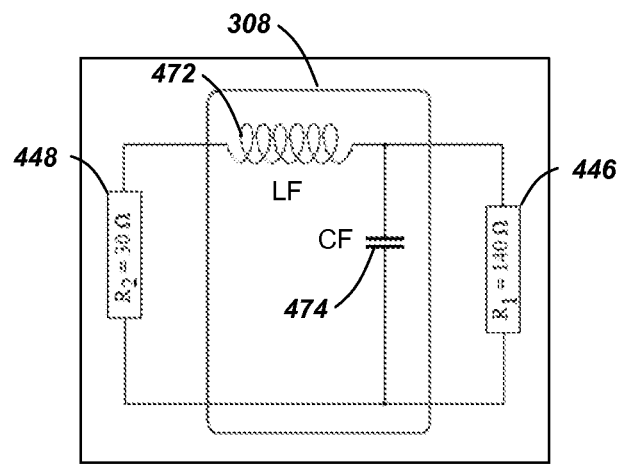
FIG. 10 illustrates a circuit diagram of a filter and matching circuit including a waveform, in accordance with an exemplary embodiment.
Figure 10:
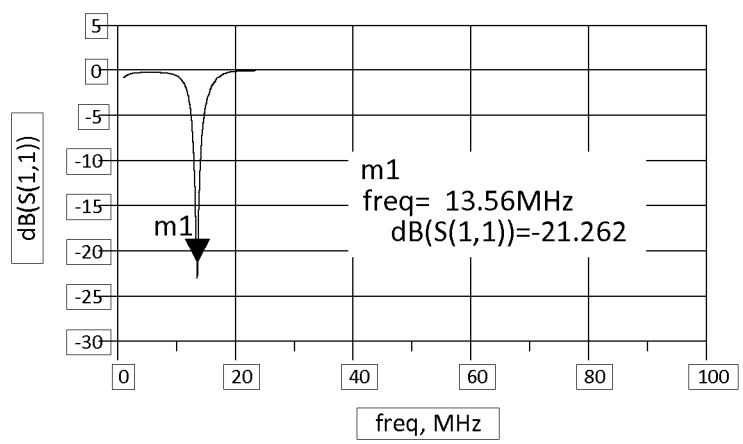

FIG. 10 illustrates a circuit diagram of a filter and matching circuit 308 of FIG. 5 and the respective frequency response. The filter and matching circuit 308, also known as a "resonant transformer" or "L-section", provides an effective approach to realize narrowband matching and a certain additional filtering effect. The impedance gradient results in the filter and matching circuit 308 being well suited to be combined with amplifier 306 (FIG. 5) configured as a class-E amplifier, since for the harmonics (e.g. at 27.12 MHz and 40.68 MHz), the filter and matching circuit 308 represents a high impedance. The bandwidth, or Q-factor, of the filter and matching circuit 308 is related to the ratio of resistance R1 446 to resistance R2 448. A higher impedance-ratio leads to a narrower bandwidth and therefore to a higher filtering effect. A matching network with a high impedance ratio results when a class-E amplifier that is designed for a low target load impedance (e.g. 8Ω) is matched to an antenna 304 that is a parallel tank (FIG. 5) typically presenting a high input impedance. In case of a charging pad antenna this impedance may be 700Ω when loaded with a receiver. This approach seems particular interesting for class E amplifiers that need to operate from low DC supply voltages and that typically perform near optimum in terms of both RF power output and efficiency when designed for low target load impedances.

Figure 11A:
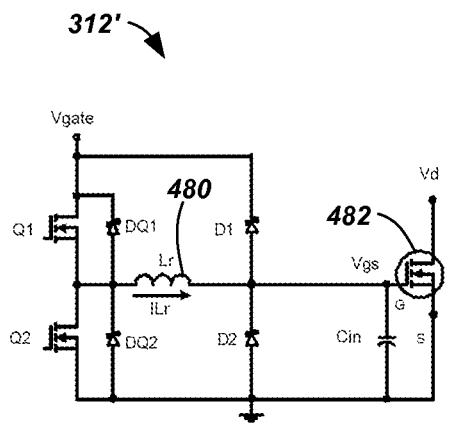
FIGS. 11A and 11B illustrate circuit diagrams of intermediate driver circuits, in accordance with exemplary embodiments.
Figure 11B:
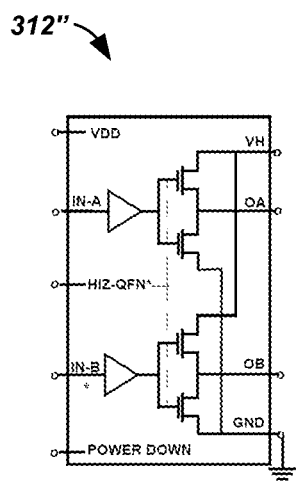

FIG. 11A and FIG. 11B illustrate circuit diagrams of intermediate driver circuits, in accordance with exemplary embodiments. As illustrated in FIG. 5, intermediate driver 312 drives the amplifier 306. Selection of intermediate driver 312 contributes to the efficiency of the transmitter 300 since power consumption by the intermediate driver 312 reduces the overall efficiency while the output signal of the intermediate driver 312 influences the switching behavior of the amplifier 306 thereby affecting the efficiency of an amplifier 306 configured as a class-E amplifier.

FIG. 11A and FIG. 11B illustrated two different intermediate driver types. FIG. 11A illustrates a resonant-type intermediate driver 312' which utilizes energy stored in the gate capacitance of the transistor 482 (e.g., MOSFET) by adding an inductor 480 to build a series tank circuit. Such an approach appears to perform adequately for higher power levels and lower frequencies, but for power levels below, for example, 10 Watts at 13.56 MHz, the additional circuitry (inductor, diodes and more complex control signals) for a resonant gate driver may incur additional complexity.

FIG. 11B illustrates a nonresonant-type intermediate driver 312" which exhibits a comparable efficiency to the resonant-type intermediate driver 312' of FIG. 11A. By way of example, a nonresonant-type intermediate driver 312' may be configured as push-pull gate drivers including a totem-pole output stage with an N-channel transistor (e.g., MOSFET) and a P-channel transistor (e.g., MOSFET) as illustrated in FIG. 11B. By way of implementation, to achieve a high efficiency with a push-pull intermediate driver, the intermediate driver should provide low $r_{DSon}$ values, fast switching speeds and a low inductance design to prevent ringing. To reduce resistive losses in the driver, several push-pull stages can be used in parallel.

A description has been provided for a wireless power transmitter configured to include an amplifier configured as a class-E amplifier. Various implementation considerations include the realization that generally, for a given volume, low inductance values can be realized with a higher quality factor than high inductance values. Furthermore with reference to FIG. 5, the oscillator 310, intermediate driver 312 and other auxiliary components (e.g., controllers) in wireless power transmitter 300 desirably operate from the same auxiliary voltage since each additional DC-DC conversion introduces a power loss and requires additional volume within the electronic device. Further design considerations include operation of the active device switch (e.g., MOSFET) at high drain voltages (e.g. 75 V for a 100 V type) and low drain currents since the $R_{DSon}$ of the used MOSFET types may be quite high, leading to higher losses with increased drain currents (could change with future semiconductors). Consequently, the target load impedance of the class-E amplifier (set by the L-section matching circuit) is desirably in a range where a good trade-off between high efficiency and high power output for given supply voltage is achieved. Optimized values, in accordance with exemplary embodiments, are in the range of 5Ω to 15Ω.

Figure 12:
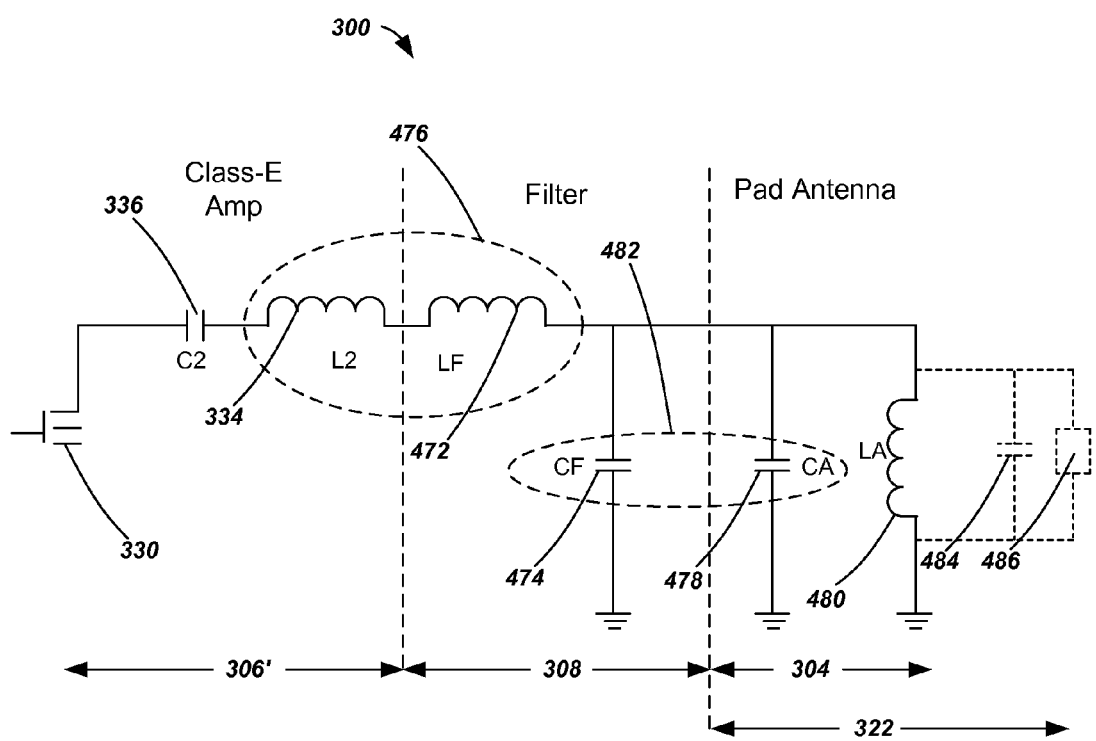
FIG. 12 illustrates a circuit diagram of portions of a wireless power transmitter, in accordance with an exemplary embodiment.

FIG. 12 illustrates a circuit diagram of portions of a wireless power transmitter, in accordance with an exemplary embodiment. Class-E amplifier 306' of FIG. 12 illustrates a partial circuit diagram of the class-E amplifier of FIG. 5 and as further detailed in FIG. 6A, FIG. 7 and FIG. 8. Specifically, class-E amplifier 306' illustrates the active device switch 330, the capacitor C2 336, and the inductor L2 334. FIG. 12 also illustrates filter and matching circuit 308 of FIG. 5 and as further detailed with respect to FIG. 10. The filter and matching circuit 308 of FIG. 5 includes the inductor LF 472 and the capacitor CF 474.

FIG. 12 illustrates that the series-configured arrangement of the inductor L2 334 of the class-E amplifier 306' and the inductor LF 472 of the filter and matching circuit 308. Accordingly, amplifier inductor L2 334 and filtering inductor LF 472 may be combined into a single element inductor 476. Wireless power transmitter 300 further includes an antenna 304 configured as a tank circuit including an antenna capacitor CA 478 and an antenna inductor LA 480 that will generally include losses which may be modeled by a series loss resistance (not shown in FIG. 12). Additionally, circuit elements 484 and 486 are included to model self capacitance (e.g. in case of a multi-turn loop antenna) and losses e.g. due to the electric stray field and presence of lossy dielectric materials. The magnetic coupling between antenna inductor LA 480 and the receive antenna is not shown in FIG. 12. FIG. 12 illustrates the parallel-configured arrangement of the filtering capacitor CF 474 and the antenna capacitor CA 478. Accordingly, the filtering capacitor CF 474 and antenna capacitor CA 478 may be combined into a single element capacitor 482.

Therefore, FIG. 12 illustrates how a transmit antenna may be efficiently driven by a class-E amplifier with the components being reduced to a single inductor 476, a single capacitor 482 and a loop antenna inductor 480. Accordingly, a wireless power transmitter has been described which results in a low bill of materials due to the use of an amplifier, matching filter, a transmit antenna combination that allows for a combination of reactive components. Furthermore, the selection of an amplifier, a matching filter and a transmit antenna allows for a combination of reactive components also resulting in a reduced number of components. Also, in an exemplary embodiment utilizing a symmetric class-E amplifier, the second harmonics of the antenna current are canceled.

Figure 13:
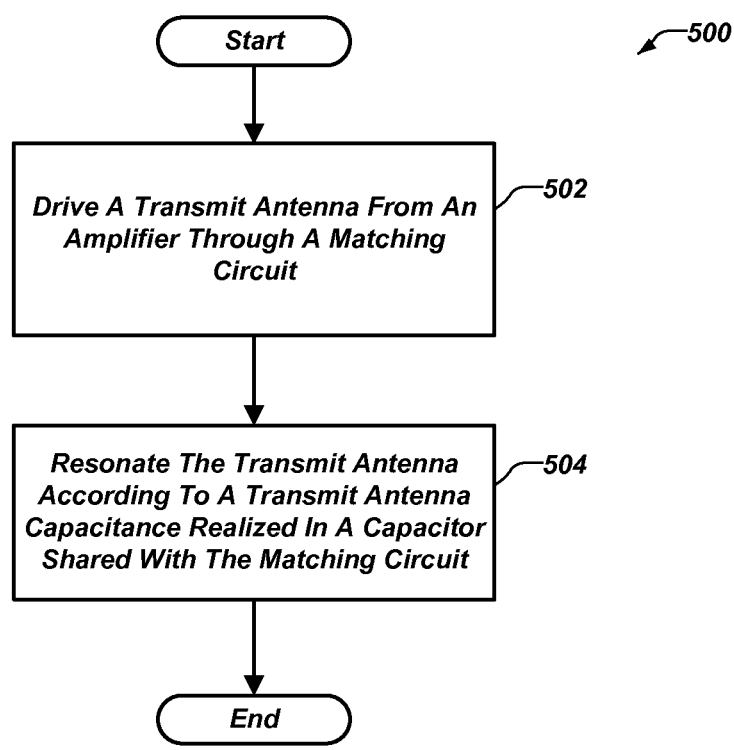
FIG. 13 is a flowchart of a method for transmitting wireless power, in accordance with an exemplary embodiment.

FIG. 13 illustrates a flowchart of a method for transmitting wireless power, in accordance with an exemplary embodiment. Method 500 for transmitting wireless power is supported by the various structures and circuits described herein. Method 500 includes a step 502 for driving a transmit antenna from an amplifier through a matching circuit. Method 500 further includes a step 504 for resonating the transmit antenna according to a transmit antenna capacitance realized in a capacitor shared with the matching circuit.

Figure 14:
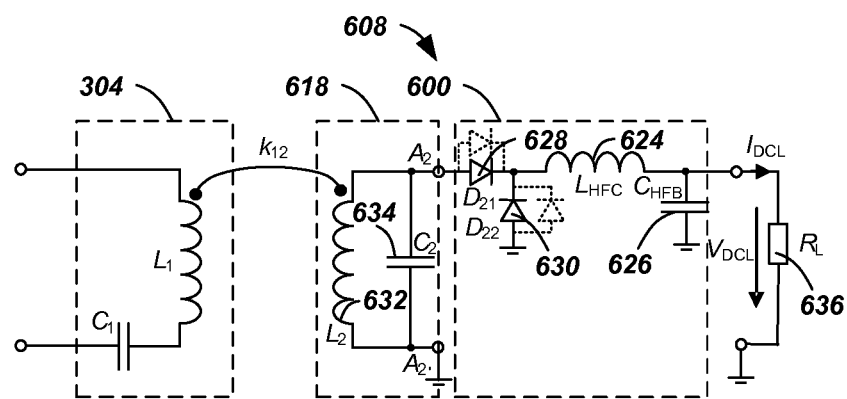
FIG. 14 illustrates a circuit diagram of a wireless power receiver, in accordance with an exemplary embodiment.

By way of an example of a wireless power receiver, FIG. 14 illustrates a circuit diagram of a wireless power receiver, in accordance with an exemplary embodiment. Wireless power receiver 608 including a resonant receive antenna 618, including inductive loop $L_2$ 632 and capacitor $C_2$ 634, and a passive double diode full wave rectifier circuit 600, in accordance with an exemplary embodiment. Rectifier circuit 600 includes diode $D_{21}$ 628 and diode $D_{22}$ 630. Rectifier circuit 600 further includes a high frequency (HF) choke $L_{HFC}$ 624 and a high frequency (HF) block capacitor $C_{HFB}$ 626. The DC path is closed via the antenna loop. HF choke 624 acts as current sink and with a diode conduction cycle D of 50%, the voltage transformation factor M is 0.5. Furthermore, the input impedance as seen at terminals $A_2$, $A_2'$ at a fundamental frequency is approximately 4 times the load resistance $R_L$ 636.

Proper selection of diodes for rectifier circuit 600 may reduce circuit losses and increase overall efficiency. For rectification efficiency, diodes may be selected based upon various parameters including peak repetitive reverse voltage ($V_{RRM}$), average rectified forward current ($I_O$), maximum instantaneous forward voltage ($V_F$), and junction capacitance ($C_j$). $V_{RRM}$ and $I_O$ are maximum ratings of the diode, whereas $V_F$ and $C_j$ are characteristic values which influence the efficiency of the rectifier.

Various diodes were tested and voltage, current and instantaneous power of each diode was calculated during the simulation to characterize the switching behavior of each type. Different switching behavior of the tested diodes were observed with the diode with the largest Cj (MBRA340T3) showing the worst switching behavior but exhibiting the smallest ON-state loss due to the reduced forward voltage. For the various diodes types tested, the ON-state loss was dominant. Specifically, the switching loss varies with the junction capacitance and the ON-state loss varies with the forward voltage. Accordingly, the total loss is dependent on the ratio of $C_j$ and $U_F$ and the operating point of the diode, which is dependent on load resistance $R_L$ 636.

A configuration of two parallel PMEG4010EH diodes proved to be the best option since the switching loss of this diode type is very small and the ON-state loss is reduced due to the parallel configuration. The rectifier diodes may be implemented as double diodes (second diodes shown in phantom) to reduce the conduction losses. The current splits up equally on both diodes thus changing the operation point of each diode compared to a single diode solution. It was also observed that a single MBRS2040LT3 performed similarly well because the forward voltage was significantly lower compared to the PMEG4010EH and the switching loss was still reasonable. Accordingly for one exemplary embodiment, a diode with a junction capacitance of about 50 pF and a forward voltage of about 380 mV@ 1 A is an acceptable choice.

Those of skill in the art would understand that control information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, and controlled by computer software, or combinations of both. To clearly illustrate this interchangeability of hardware and software, various illustrative components, blocks, modules, circuits, and steps have been described above generally in terms of their functionality. Whether such functionality is implemented and controlled as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be controlled with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The control steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the control functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A wireless power transmitter, comprising:
   a transmit circuit configured as a resonant tank comprising a first capacitor coupled with a first inductor, the transmit circuit configured to wirelessly transmit power in response to a time-varying signal; and
   a driver circuit operably coupled to the transmit circuit, the driver circuit configured to generate the time-varying signal, the driver circuit comprising:
   a second inductor coupled in series with the transmit circuit; and
   a second capacitor coupled in series with the second inductor and the transmit circuit;
   wherein the second inductor and the first capacitor define a filter configured to provide load matching and/or filtering of a signal generated by the driver or the transmit circuit.

2. The wireless power transmitter of claim 1, further comprising an intermediate driver circuit operably connected to the driver circuit and configured to drive the driver circuit.

3. The wireless power transmitter of claim 2, wherein the intermediate driver circuit is configured as one of a resonant-type intermediate driver circuit or a push-pull intermediate driver circuit.

4. The wireless power transmitter of claim 1, wherein the driver circuit is configured as a class-E driver circuit.

5. The wireless power transmitter of claim 4, wherein the class-E driver circuit is configured as a single-ended class-E driver circuit.

6. The wireless power transmitter of claim 4, wherein the class-E driver circuit is configured as a push-pull class-E driver circuit.

7. A method for transmitting wireless power, comprising:
   transmitting power wirelessly, by a transmit circuit, in response to a time-varying signal, the transmit circuit configured as a resonant tank comprising a first capacitor coupled with a first inductor;
   generating, by a driver circuit, the time-varying signal, the driver circuit comprising a second inductor coupled in series with the transmit circuit, and a second capacitor coupled in series with the second inductor and the transmit circuit; and
   matching and/or filtering the time-varying signal by a filter comprising the second inductor and the first capacitor.

8. The method of claim 7, further comprising an intermediate driver circuit operably connected to the driver circuit and configured to drive the driver circuit.

9. The method of claim 8, wherein the intermediate driver circuit is configured as one of a resonant-type intermediate driver circuit or a push-pull intermediate driver circuit with the transmit circuit.

10. The method of claim 7, wherein the driver circuit is configured as a class-E driver circuit.

11. The method of claim 10, wherein the class-E driver circuit is configured as a single-ended class-E driver circuit.

12. The method of claim 7, wherein the class-E driver circuit is configured as a push-pull class-E driver circuit.

13. A driver circuit for use in wireless power transmitter, comprising:
   means for transmitting power wirelessly in response to a time-varying signal, the means for transmitting comprising means for storing energy in a first electric field coupled with means for storing energy in a first magnetic field; and means for generating the time-varying signal, the means for generating comprising means for storing energy in a second electric field coupled in series with the means for transmitting power, and means for storing energy in a second magnetic field coupled in series with the means for transmitting power and the means for storing energy in a second electric field;

wherein the means for storing energy in a second magnetic field and the means for storing energy in a first electric field define a means for filtering which provides load matching and/or filtering of the time-varying signal.

14. The wireless power transmitter of claim 13, further comprising an intermediate driver circuit operably connected to the means for generating and configured to drive the means for generating.

15. The wireless power transmitter of claim 14, wherein the intermediate driver circuit is configured as one of a resonant-type intermediate driver circuit or a push-pull intermediate driver circuit.

16. The wireless power transmitter of claim 13, wherein the means for generating is configured as a class-E driver circuit.

17. The wireless power transmitter of claim 16, wherein the class-E driver circuit is configured as a single-ended class-E driver circuit.

18. The wireless power transmitter of claim 13, wherein the class-E driver circuit is configured as a push-pull class-E driver circuit.

19. A wireless power transmitter, comprising:
a transmit circuit configured as a resonant tank comprising a first capacitor coupled with a first inductor, the transmit circuit configured to wirelessly transmit power in response to a time-varying signal to power or charge a receiver device; and
a driver circuit operably coupled to the transmit circuit, the driver circuit configured to generate the time-varying signal, the driver circuit comprising:
a first driver stage circuit comprising:
a first switch configured to control the time-varying signal in response to a first control signal;
a second capacitor coupled in parallel with the first switch;
a third capacitor coupled to the first switch and to the second capacitor; and
a second inductor coupled to the first switch and to the second capacitor; and
a second driver stage circuit comprising:
a second switch configured to control the time-varying signal in response to a second control signal;
a fourth capacitor coupled in parallel with the second switch;
a fifth capacitor coupled to the second switch and to the fourth capacitor; and
a third inductor coupled to the second switch and to the fourth capacitor.

20. The wireless power transmitter of claim 19, wherein the transmit circuit is coupled in parallel with the driver circuit.

21. The wireless power transmitter of claim 19, wherein the first driver stage circuit is configured as a class-E amplifier circuit, and wherein the second driver stage circuit is configured as a class-E amplifier circuit.

* * * * *